(12) United States Patent
Ryu et al.

(10) Patent No.: US 11,194,653 B2
(45) Date of Patent: Dec. 7, 2021

(54) SEMICONDUCTOR MEMORY DEVICE, AND MEMORY SYSTEM HAVING THE SAME

(71) Applicant: SAMSUNG ELECTRONICS CO., LTD., Suwon-si (KR)

(72) Inventors: Yesin Ryu, Suwon-si (KR); Sanguhn Cha, Suwon-si (KR); Hyungi Kim, Suwon-si (KR); Hoon Shin, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 41 days.

(21) Appl. No.: 16/668,090

(22) Filed: Oct. 30, 2019

(65) Prior Publication Data
US 2020/0319960 A1    Oct. 8, 2020

(30) Foreign Application Priority Data

Apr. 3, 2019 (KR) .................... 10-2019-0038816

(51) Int. Cl.
*G06F 11/10* (2006.01)
*G11C 29/42* (2006.01)

(52) U.S. Cl.
CPC ........ *G06F 11/1008* (2013.01); *G06F 11/108* (2013.01); *G11C 29/42* (2013.01)

(58) Field of Classification Search
CPC ..... G06F 11/108; G06F 11/1008; G11C 29/42
See application file for complete search history.

(56) References Cited

U.S. PATENT DOCUMENTS

| 5,996,105 | A | 11/1999 | Zook |
| 6,678,860 | B1* | 1/2004 | Lee ..................... G06F 11/1024 714/735 |
| 7,181,677 | B1 | 2/2007 | Weng |
| 7,237,175 | B2* | 6/2007 | Hatakenaka ........ G06F 11/1012 714/763 |
| 8,166,370 | B1 | 4/2012 | Tang et al. |
| 8,276,045 | B2 | 9/2012 | Cideciyan et al. |
| 8,555,142 | B2* | 10/2013 | Grube ............... H03M 13/3761 714/764 |
| 8,949,695 | B2* | 2/2015 | Grube ................. G06F 21/6272 714/770 |
| 9,104,591 | B2 | 8/2015 | Tam |
| 9,430,326 | B2 | 8/2016 | Barndt |
| 9,577,673 | B2 | 2/2017 | Parthasarathy et al. |

(Continued)

*Primary Examiner* — Steve N Nguyen
(74) *Attorney, Agent, or Firm* — Sughrue Mion, PLLC

(57) ABSTRACT

A semiconductor memory device and a memory system including the same are provided. The semiconductor memory device includes a memory cell array including memory blocks, a local parity memory block, and a register block. The memory blocks respectively store pieces of partial local data in response to a plurality of column selection signals, or a first partial global parity in response to a global parity column selection signal. The local parity memory block stores local parities of local data in response to the plurality of column selection signals, or a second partial global parity in response to the global parity column selection signal. The register block generates a global parity including the first partial global parities and the second partial global parity. Each piece of local data includes the partial local data, and the global parity is a parity of the pieces of local data and the local parities.

18 Claims, 15 Drawing Sheets

(56) References Cited

U.S. PATENT DOCUMENTS

| | | |
|---|---|---|
| 10,153,782 B2 | 12/2018 | Cai et al. |
| 10,310,736 B1 * | 6/2019 | Yu .................. G06F 11/1453 |
| 2010/0180180 A1 | 7/2010 | Cideciyan et al. |
| 2014/0129896 A1 | 5/2014 | Parthasarathy et al. |
| 2014/0164879 A1 | 6/2014 | Tam |
| 2015/0082122 A1 * | 3/2015 | Udipi .................. G06F 11/1044 |
| | | 714/764 |
| 2016/0026525 A1 | 1/2016 | Barndt |
| 2016/0315635 A1 | 10/2016 | Cai et al. |
| 2018/0341548 A1 * | 11/2018 | Bolkhovitin ...... H03M 13/2942 |

\* cited by examiner

FIG. 4

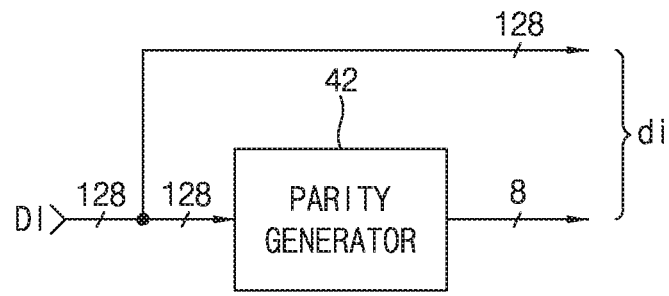

FIG. 5

$$H \cdot R = \begin{pmatrix} & C1 & C2 & \cdots & C128 & C129 & C130 & \cdots & C136 \\ R1 & h11 & h12 & \cdots & h1128 & 1 & 0 & \cdots & 0 \\ R2 & h21 & h22 & \cdots & h2128 & 0 & 1 & \cdots & 0 \\ & \cdot & \cdot & \cdot & \cdot & \cdot & \cdot & & \cdot \\ & \cdot & \cdot & \cdot & \cdot & \cdot & \cdot & & \cdot \\ & \cdot & \cdot & \cdot & \cdot & \cdot & \cdot & & \cdot \\ R8 & h81 & h82 & \cdots & h8128 & 0 & 0 & \cdots & 1 \end{pmatrix} \begin{pmatrix} r1 \\ r2 \\ \cdot \\ \cdot \\ \cdot \\ r128 \\ P1 \\ P2 \\ \cdot \\ \cdot \\ P8 \end{pmatrix} = \begin{pmatrix} 0 \\ 0 \\ \cdot \\ \cdot \\ \cdot \\ 0 \end{pmatrix}$$

SEMICONDUCTOR MEMORY DEVICE, AND MEMORY SYSTEM HAVING THE SAME

CROSS-REFERENCE TO RELATED APPLICATION

This application claims priority from Korean Patent Application No. 10-2019-0038816, filed on Apr. 3, 2019, the disclosure of which is herein incorporated by reference in its entirety.

BACKGROUND

1. Field

Devices and systems consistent with example embodiments relate to a semiconductor memory device and a memory system including the same.

2. Description of Related Art

A semiconductor memory device may include a memory cell array. In general, the semiconductor memory device may perform ECC encoding and decoding operations on data, which are applied to and output from the memory cell array.

SUMMARY

It is an aspect to provide a semiconductor memory device which may perform error correcting code (ECC) encoding and decoding operations on data of at least two different data units and a memory system including the semiconductor memory device.

Aspects of the inventive concept should not be limited by the above description, and other unmentioned aspects will be clearly understood by one of ordinary skill in the art from example embodiments described herein.

According to an aspect of example embodiments, there is provided a semiconductor memory device comprising a memory cell array comprising a plurality of memory blocks configured to respectively store a plurality of pieces of partial local data in response to a plurality of column selection signals, or a first partial global parity in response to a global parity column selection signal; a local parity memory block configured to store a plurality of local parities of a plurality of pieces of local data in response to the plurality of column selection signals, or a second partial global parity in response to the global parity column selection signal; and a register block configured to generate a global parity comprising the plurality of first partial global parities and the second partial global parity, wherein each of the plurality of pieces of local data comprises the plurality of pieces of partial local data, and the global parity is a parity of the plurality of pieces of local data and the plurality of local parities.

According to another aspect of example embodiments, there is provided a memory system comprising a controller configured to output a command/address, transmit input data, and receive output data; and a memory configured to receive the command/address and the input data and transmit the output data, wherein the memory comprises a memory cell array comprising a plurality of memory blocks configured to respectively store a plurality of pieces of partial local data in response to a plurality of column selection signals or a first partial global parity in response to a global parity column selection signal; a local parity memory block configured to store a plurality of local parities of a plurality of pieces of local data in response to the plurality of column selection signals, or a second partial global parity in response to the global parity column selection signal; and a register block configured to generate a global parity comprising the plurality of first partial global parities and the second partial global parity, wherein each of the plurality of pieces of local data comprises the plurality of pieces of partial local data, and the global parity is a parity of the plurality of pieces of local data and the plurality of local parities.

BRIEF DESCRIPTION OF THE DRAWINGS

FIG. 4 is a diagram illustrating an error correcting code (ECC) encoder according to an example embodiment;

FIG. 5 is a diagram illustrating a parity operation of the parity generator according to an example embodiment;

DETAILED DESCRIPTION

Hereinafter, a semiconductor memory device and a memory system including the same according to example embodiments will be described with reference to the accompanying drawings.

Figure 1A:
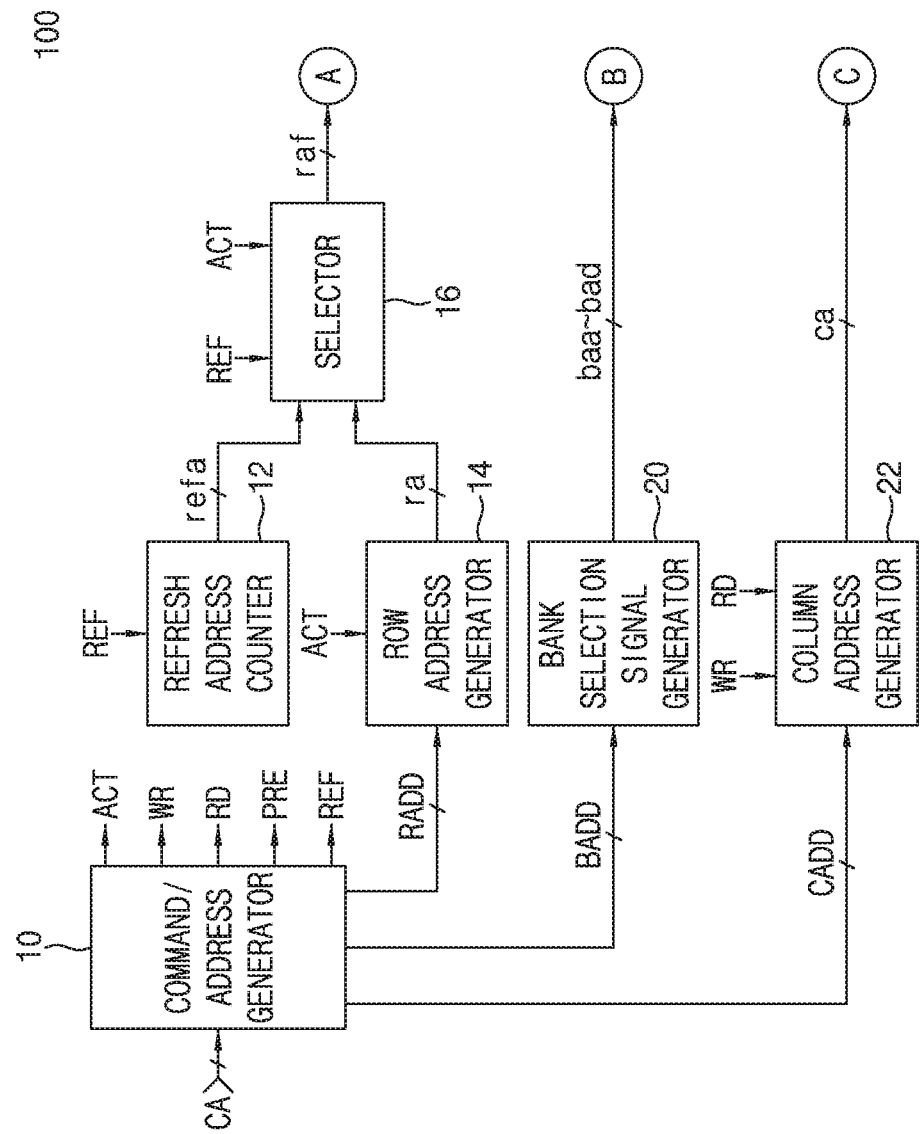
FIGS. 1A and 1B are block diagrams of a semiconductor memory device according to an example embodiment.
Figure 1B:
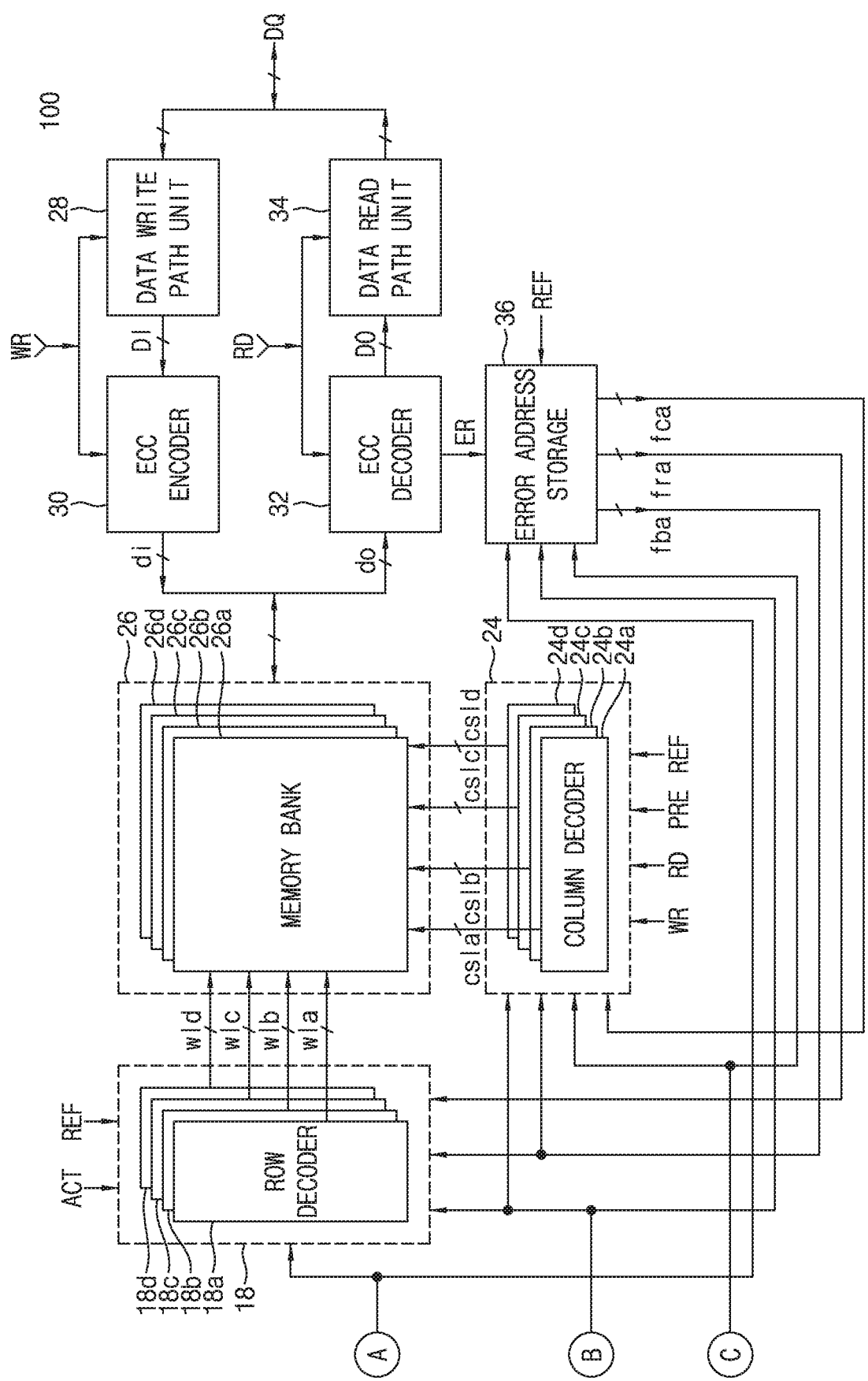

FIGS. 1A and 1B are block diagrams of a semiconductor memory device according to an example embodiment.

A semiconductor memory device 100 may include a command/address generator 10, a refresh address counter 12, a row address generator 14, a selector 16, a row decoder 18, a bank selection signal generator 20, a column address generator 22, a column decoder 24, a memory cell array 26, a data write path unit 28, an error correcting code (ECC)

encoder 30, an ECC decoder 32, a data read path unit 34, and an error address storage 36. The memory cell array 26 may include, for example, four memory banks 26a, 26b, 26c, and 26d. The row decoder 18 may include, for example, four row decoders 18a, 18b, 18c, and 18d, and the column decoder 24 may include, for example, four column decoders 24a, 24b, 24c, and 24d. That is, one row decoder 18 and one column decoder 24 may be included in each memory bank. Unlike that which is shown, one ECC encoder 30, one ECC decoder 32, and one error address storage 36 may also be included in each memory bank.

Functions of respective blocks shown in FIGS. 1A and 1B will be described as follows.

When a command/address CA is applied, the command/address generator 10 may decode a command signal included in the command/address CA, generate an active command ACT, a write command WR, a read command RD, a precharge command PRE, or a refresh command REF and generate an address signal included in the command/address CA as a bank address signal BADD, a row address signal RADD, and a column address signal CADD. For example, the command/address generator 10 may generate the bank address signal BADD and the row address signal RADD along with the active command ACT and generate the column address signal CADD along with the write command WR or the read command RD.

The refresh address counter 12 may generate a refresh row address refa in response to the refresh command REF.

The row address generator 14 may receive the row address signal RADD in response to the active command ACT and generate a row address ra.

The selector 16 may generate the refresh row address refa as a final row address raf in response to the refresh command REF and generate the row address ra as the final row address raf in response to the active command ACT.

Each of the row decoders 18a, 18b, 18c, and 18d may decode the final row address raf in response to the active command ACT and a corresponding bank selection signal baa, bab, bac, or bad and activate one of a plurality of corresponding word line selection signals wla, wlb, wlc or wld. Further, each of the row decoders 18a, 18b, 18c, and 18d may decode the final row address raf in response to the refresh command REF and the corresponding bank selection signal baa, bab, bac, or bad and activate at least one of a plurality of corresponding word line selection signals wla, wlb, wlc or wld. In addition, each of the row decoders 18a, 18b, 18c, and 18d may decode a fail row address fra in response to the refresh command REF and a fail bank address fba and activate a fail word line selection signal of one of a plurality of corresponding word line selection signals wla, wlb, wlc, or wld of a fail memory bank of one of the four memory banks 26a, 26b, 26c, and 26d.

The bank selection signal generator 20 may decode the bank address BADD and generate bank selection signals baa, bab, bac, and bad.

The column address generator 22 may receive the column address signal CADD in response to the write command WR or the read command RD and generate a column address ca.

Each of the column decoders 24a, 24b, 24c, and 24d may decode the column address ca in response to the write command WR or the read command RD and the corresponding bank selection signal baa, bab, bac, or bad and activate one of a plurality of corresponding column selection signals csla, cslb, cslc, or csld. Further, each of the column decoders 24a, 24b, 24c, and 24d may activate a global parity column selection signal (not shown) of a plurality of corresponding column selection signals csla, cslb, cslc, or csld in response to the precharge command PRE and the corresponding bank selection signal baa, bab, bac, or bad. In addition, each of the column decoders 24a, 24b, 24c, and 24d may sequentially activate all of a plurality of corresponding column selection signals csla, cslb, cslc, or csld of a fail memory bank in response to the refresh command REF and the fail bank address fba and activate a fail column selection signal (not shown) in response to the refresh command REF, the fail bank address fba, and a fail column address fca.

Each of the memory banks 26a, 26b, 26c, and 26d may include a plurality of memory cells (not shown) and store data di in memory cells, which are selected by one of a plurality of corresponding word line selection signals wla, wlb, wlc, or wld and one of a plurality of corresponding column selection signals csla, cslb, cslc, or csld or output data stored in selected memory cells to data do. Further, each of the memory banks 26a, 26b, 26c, and 26d may perform a refresh operation on memory cells that are selected by at least one of the plurality of corresponding word line selection signals wla, wlb, wlc, or wld.

The data write path unit 28 may sequentially receive data DQ, which is applied from the outside of the semiconductor memory device 100, in a serial manner as many times as the number corresponding to a burst length and output local data DI in a parallel manner. For example, when the number of data input/output (I/O) terminals (pins or balls) of the semiconductor memory device 100 is n (e.g., 16) and the burst length is set to k (e.g., 8), the data write path unit 28 may sequentially receive n-bit data DQ k times in a serial manner and generate n×k-bit (e.g., 128-bit) local data DI in a parallel manner.

The ECC encoder 30 may perform a local ECC encoding operation on the local data DI, generate a local parity for the local data DI, and generate the local data DI including the local parity as data di. For example, the ECC encoder 30 may perform a local ECC encoding operation on n×k-bit (e.g., 128-bit) local data DI, generate an m-bit (e.g., 8-bit) local parity for the n×k-bit local data DI, and generate (n×k)+m-bit (e.g., 136-bit) data di.

The ECC decoder 32 may perform a local ECC decoding operation on the data do to detect whether there is an error in the data do and generate local data DO. Further, when the error is detected, the ECC decoder 32 may generate an error signal ER. For example, the ECC decoder 32 may perform a local ECC decoding operation on (n×k)+m-bit (e.g., 136-bit) data do, generate a syndrome for the data do, and detect whether there is an error using the syndrome.

The data read path unit 34 may receive the data DO and sequentially generate data DQ in a serial manner as many times as the number corresponding to the burst length. For instance, when the number of data I/O terminals (pins or balls) of the semiconductor memory device 100 is n (e.g., 16) and the burst length is set to k (e.g., 8), the data read path unit 34 may receive n×k-bit (e.g., 128-bit) data DO and sequentially generate n-bit data DQ k times in a serial manner.

The error address storage 36 may store the bank selection signals baa to bad, the final row address raf, and the column address ca as a fail bank selection signal fba, a fail final row address fra, and the fail column address fca in response to the error signal ER. Further, the error address storage 36 may generate the fail bank selection signal fba, the fail final row address fra, and the fail column address fca in response to the refresh command REF.

Figure 2:
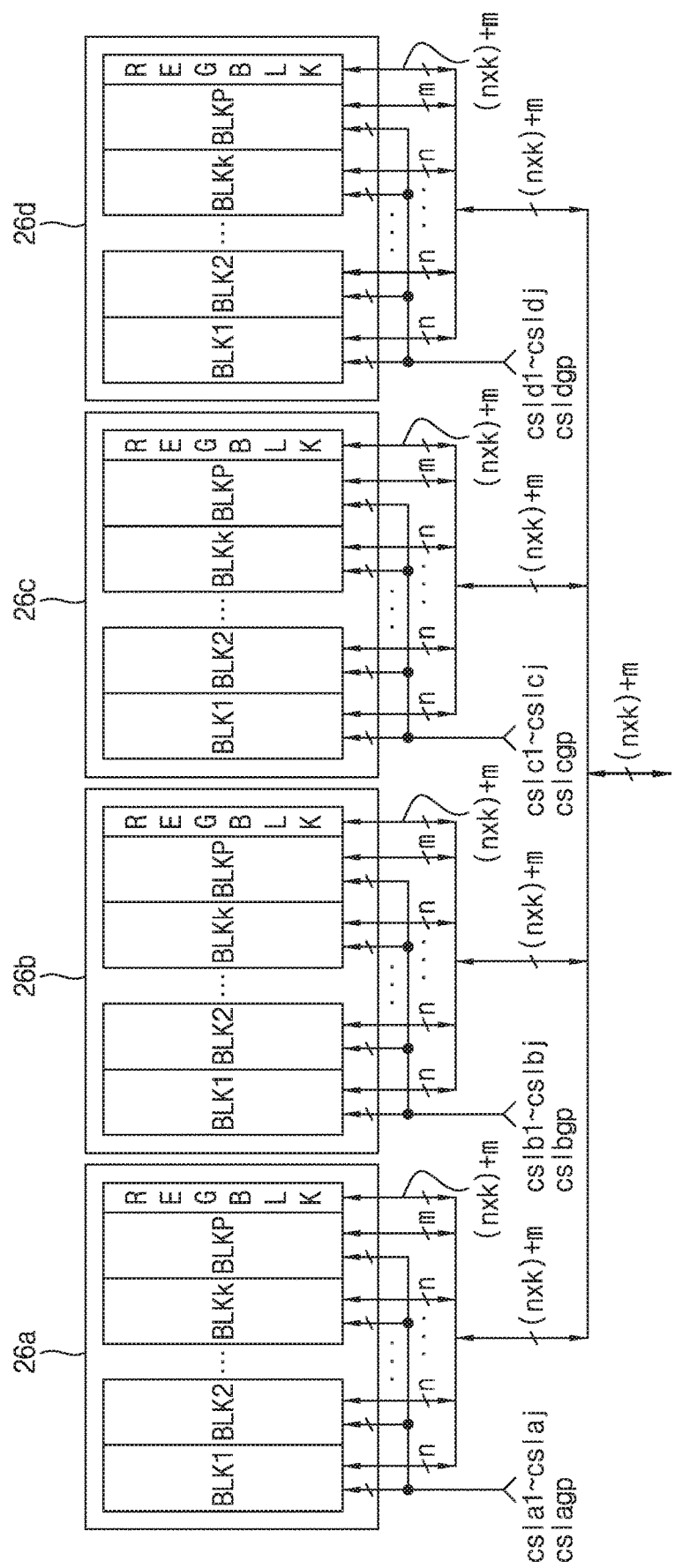
FIG. 2 is a block diagram illustrating a configuration of memory banks according to an example embodiment.

FIG. 2 is a block diagram illustrating a configuration of memory banks according to an example embodiment. Each of the memory banks 26a, 26b, 26c, and 26d may include k memory blocks BLK1 to BLKk, a local parity memory block BLKP, and a register block REGBLK.

Referring to FIG. 2, each of k (e.g., 8) memory blocks BLK1 to BLKk of each of the memory banks 26a, 26b, 26c, and 26d may receive, store, and output n-bit (e.g., 16-bit) partial data in response to one of j (e.g., 64) corresponding column selection signals csla1 to cslaj, cslb1 to cslbj, cslc1 to cslcj, or csld1 to csldj and receive, store, and output an n-bit partial global parity in response to a corresponding global parity column selection signal cslagp, calbgp, cslcgp, or csldgp.

The local parity memory block BLKP of each of the memory banks 26a, 26b, 26c, and 26d may receive, store, and output an 8-bit local parity in response to one of j corresponding column selection signals csla1 to cslaj, cslb1 to cslbj, cslc1 to cslcj, or csld1 to csldj and receive, store, and output an m-bit (e.g., 8-bit) partial global parity in response to the corresponding global parity column selection signal cslagp, calbgp, cslcgp, or csldgp.

That is, each of the memory banks 26a, 26b, 26c, and 26d may receive, store, and output (n×k)-bit (e.g., 128-bit) local data and an m-bit local parity in response to one of the j corresponding column selection signals csla1 to cslaj, cslb1 to cslbj, cslc1 to cslcj, or csld1 to csldj or receive, store, and output an (n×k)+m-bit (e.g., 136-bit) global parity in response to the corresponding column selection signal cslagp, calbgp, cslcgp, or csldgp.

The register block REGBLK of each of the memory banks 26a, 26b, 26c, and 26d may store an (n×k)+m-bit global parity, which is output from the k memory blocks BLK1 to BLKk and the local parity memory block BLKP of the corresponding memory bank 26a, 26b, 26c, or 26d, compare the (n×k)+m-bit global parity with the (n×k)-bit local data and the m-bit local parity, and generate an (n×k)+m-bit global parity and output the generated (n×k)+m-bit global parity to the k memory blocks BLK1 to BLKk and the local parity memory block BLKP of the corresponding memory bank 26a, 26b, 26c, or 26d.

Figure 3:
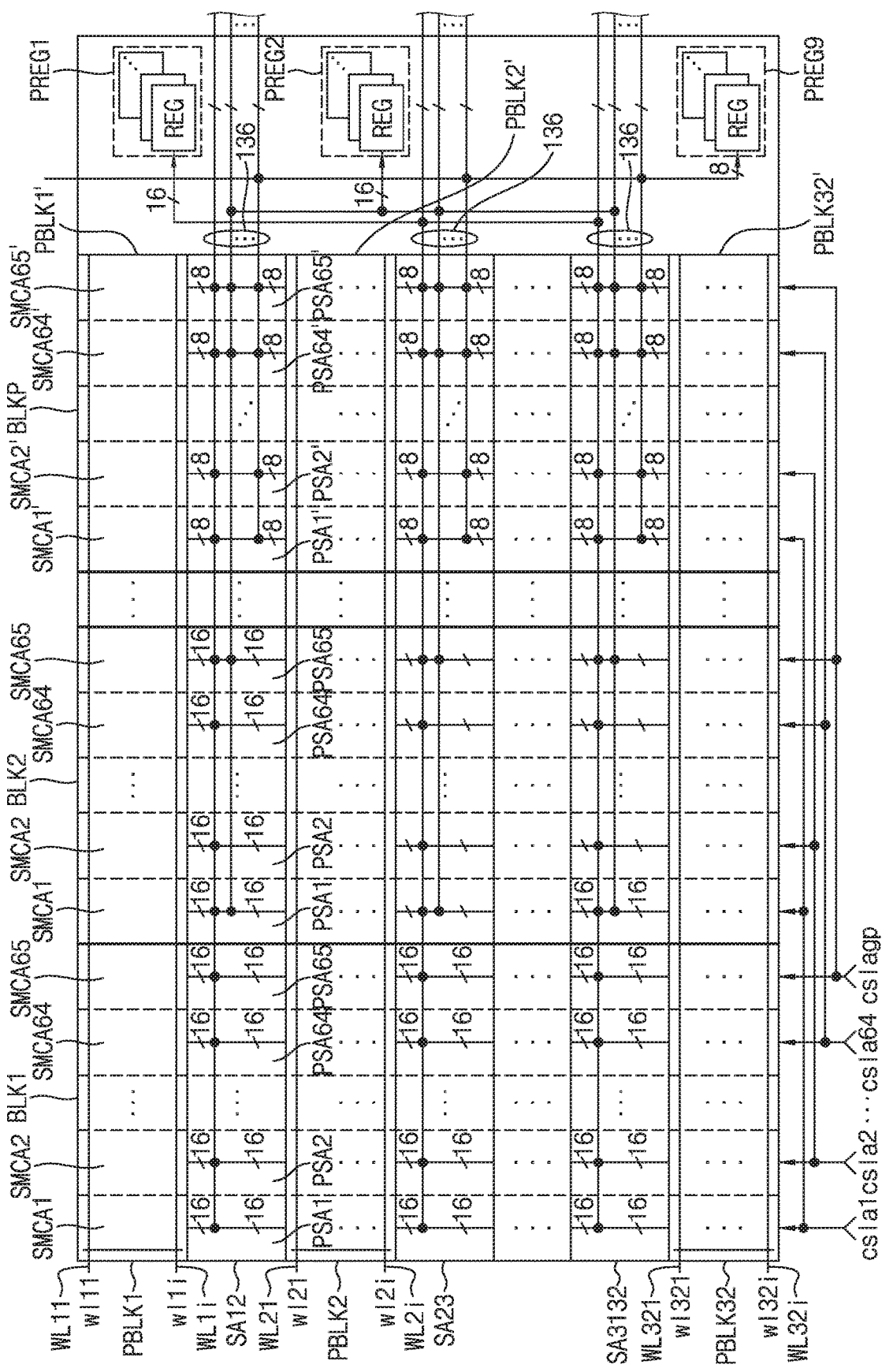
FIG. 3 is a diagram illustrating a configuration of k memory blocks and a local parity memory block of each memory bank according to an example embodiment.

FIG. 3 is a diagram illustrating a configuration of k memory blocks BLK1 to BLKk and a local parity memory block BLKP of each memory bank according to an example embodiment. Each of the k memory blocks BLK1 to BLKk may include thirty-two partial memory blocks PBLK1 to PBLK32 and thirty-one sense amplification blocks SA12 to SA3132, which are arranged in a bit line direction. The thirty-one sense amplification blocks SA12 to SA3132 may be respectively disposed between pairs of adjacent partial memory blocks PBLK1 and PBLK2, PBLK2 and PBLK3 (not shown), . . . , and PBLK31 (not shown) and PBLK32. Each of the thirty-two partial memory blocks PBLK1 to PBLK32 may include sixty-five sub-memory blocks SMCA1 to SMCA65, which are disposed in a word line direction. Each of the thirty-one sense amplification blocks SA12 to SA3132 may include sixty-five partial sense amplification blocks PSA1 to PSA65. Each of the sixty-five partial sense amplification blocks PSA1 to PSA65 may be shared between two sub-memory blocks SMCA1, SMCA2, . . . , or SMCA65, which are adjacent in the bit line direction. Each of the sixty-five sub-memory blocks SMCA1 to SMCA65 may receive and output 16-bit partial local data or a 16-bit partial global parity in response to one of a plurality of corresponding word lines wl1 to wli, wl21 to wl2i, . . . , or wl321 to wl32i and a corresponding column selection signal csla1, csla2, . . . , or cslagp. Each of the sixty-five partial sense amplification blocks PSA1 to PSA65 may amplify and receive the 16-bit partial local data or the 16-bit partial global parity, which is applied to one block of two corresponding sub-memory blocks SMCA1, SMCA2, . . . , or SMCA65, which are adjacent to each other, or amplify and output the 16-bit partial local data or the 16-bit partial global parity, which is output from one block of two corresponding sub-memory blocks SMCA1, SMCA2, . . . , or SMCA65.

The local parity memory block BLKP may include thirty-two partial memory blocks PBLK1' to PBLK32' and thirty-one sense amplification blocks SA12' to SA3132', which are disposed in the bit line direction. The thirty-one sense amplification blocks SA12' to SA3132' may be respectively disposed between pairs of adjacent partial memory blocks PBLK1' and PBLK2', PBLK2' and PBLK3' (not shown), . . . , and PBLK31' (not shown) and PBLK32'. Each of the thirty-two partial memory blocks PBLK1' to PBLK32' may include sixty-five sub-memory blocks SMCA1' to SMCA65', which are disposed in the word line direction, and each of the thirty-one sense amplification blocks SA12' to SA3132 may include sixty-five partial sense amplification blocks PSA1' to PSA65'. Each of the sixty-five partial sense amplification blocks PSA1' to PSA65' may be shared between two sub-memory blocks SMCA1', SMCA2', . . . , or SMCA65', which are adjacent in the bit line direction. Each of the sixty-five sub-memory blocks SMCA1' to SMCA65' may receive and output an 8-bit local parity or an 8-bit partial global parity in response to one of the plurality of corresponding word lines wl1 to wli, wl21 to wl2i, . . . , or wl321 to wl32i and the corresponding column selection signal csla1, csla2, . . . , or cslagp. Each of the sixty-five partial sense amplification blocks PSA1' to PSA65' may amplify and receive the 8-bit local parity or the 8-bit partial global parity, which is applied to one block of pairs of two corresponding sub-memory blocks SMCA1', SMCA2', . . . , or SMCA65', which are adjacent to each other, or amplify and output the 8-bit local parity or the 8-bit partial global parity, which is output from one block of pairs of two corresponding sub-memory blocks SMCA1', SMCA2', . . . , or SMCA65', which are adjacent to each other.

In FIG. 3, word lines WL11 to WL1i, WL21 to WL2i, . . . , and WL321 to WL32i indicate word lines respectively selected in response to word line selection signals wl11 to wl1i, wl21 to wl2i, . . . , and wl321 to wl32i, and a bit line BL denotes one representative bit line.

The register block REGBLK may include 9 partial register blocks PREG1 to PREG9. Each of the eight partial register blocks PREG1 to PREG8 may include sixteen registers REG. The remaining one partial register block PREG9 may include eight registers REG.

The partial register block PREG1 may be connected in common to the sixty-five partial sense amplification blocks PSA1 to PSA65 of each of the thirty-one sense amplification blocks SA12, SA23, . . . , and SA3132 included in the memory block BLK1. The sixteen registers REG of the partial register block PREG1 may store the 16-bit partial local data or the 16-bit partial global parity. The partial register block PREG2 may be connected in common to the sixty-five partial sense amplification blocks PSA1 to PSA65 of each of the thirty-one sense amplification blocks SA12, SA23, . . . , and SA3132 included in the memory block BLK2. The sixteen registers REG of the partial register block PREG2 may store the 16-bit partial local data or the 16-bit partial global parity. Similarly, each of the partial register blocks PREG3 to PREG8 may be connected in common to the sixty-five corresponding partial sense amplification blocks PSA1 to PSA65 of each of the thirty-one sense amplification blocks SA12, SA23, . . . , and SA3132 included in the corresponding memory block BLK3, BLK4, . . . , or BLK8. The sixteen corresponding registers REG of each of the partial register block PREG3 to PREG8 may store the corresponding 16-bit partial local data or the corresponding 16-bit global parity. The partial register block PREG9 may be connected in common to the sixty-five corresponding partial sense amplification blocks PSA1' to PSA65' of each of the thirty-one sense amplification blocks SA12, SA23, . . . , and SA3132 included in the memory block BLKP. The eight registers REG of the partial register block PREG9 may store the 8-bit local parity or the 8-bit partial global parity.

FIG. 4 is a diagram illustrating an ECC encoder 30 according to an example embodiment. An ECC encoder 30 may include a parity generator 42.

Referring to FIG. 4, the parity generator 42 may receive the local data DI applied from the data write path unit 28 and generate the data di including the local data and the local parity. For example, the parity generator 42 may generate the 8-bit local parity using a first H matrix H1 and the 128-bit local data.

FIG. 5 is a diagram illustrating a parity operation of the parity generator 42 according to an example embodiment.

Referring to FIG. 5, a first H matrix H may be an 8×136 matrix, and a matrix R of 128-bit local data and an 8-bit local parity may be a 136×1 matrix. In the first H matrix H, codes h11 to h81, h12 to h82, . . . , h1128 to h8128, 10 . . . 0, 01 . . . 0, and 00 . . . 1 of 136 column vectors C1 to C136 may have respectively different codes including "0" and/or "1" except codes having all "0"s. Further, for example, the first H matrix H may be generated using a polynomial code "111001111" according to a cyclical redundancy check (CRC) generation polynomial which is $X^8+X^7+X^6+X^3+X^2+X+1$. That is, after an 8-bit code "00000000" having all "0"s is added behind each of $2^{128}$ different 128-bit datawords including codewords h11 to h1128, h21 to h2128, . . . , and h81 to h8128 of row vectors R1 to R8 of the first H matrix H, each of $2^{128}$ different 136-bit datawords may be divided by the polynomial code to obtain an 8-bit remainder. The corresponding 8-bit remainder may be added behind each of the $2^{128}$ different 128-bit datawords to generate $2^{128}$ different 136-bit codewords. The first H matrix H may include codewords in which the 8-bit remainder is expressed as "10000000", "01000000", . . . , and "00000001" (having "1" in a diagonal direction) and a minimum hamming distance dmin between any two codewords of codewords h11 to h12810000000, h21 to h212801000000, . . . , and h81 to h812800000001 of the row vectors R1 to R8 is 3, from among the $2^{128}$ different 136-bit codewords. The first H matrix H may detect every 1-bit error, a 2-bit error having two isolated 1-bit errors, and a multi-bit error within 8 consecutive bits.

Referring to FIGS. 4 and 5, the parity generator 42 may perform an exclusive OR (XOR) operation on each of the 128-bit codewords h11 to h128, h21 to h2128, . . . , and h81 to h8128 included in the row vectors R1 to R8 of the first H matrix H and 128-bit local data r1 to r128 of the 136×1 matrix and perform a modulo-2 operation on results of the XOR operations to generate 8-bit local parities P1 to P8.

That is, the 8-bit local parities P1 to P8 may be expressed by the following equation:

$$P1 = h11 \wedge r1 + h12 \wedge r2 + \ldots + h1128 \wedge r128$$

$$P2 = h21 \wedge r1 + h22 \wedge r2 + \ldots + h2128 \wedge r128$$

$$\ldots$$

$$P8 = h81 \wedge r1 + h22 \wedge r2 + \ldots + h8128 \wedge r128,$$

wherein "^" denotes an XOR operator, and "+" denotes a modulo2 operator.

Figure 6:
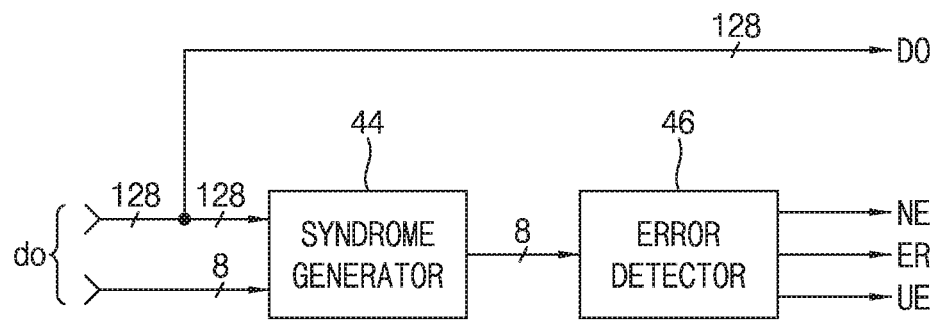
FIG. 6 is a diagram illustrating a configuration of an ECC decoder according to an example embodiment.

FIG. 6 is a diagram illustrating a configuration of an ECC decoder 32 according to an example embodiment. The ECC decoder 32 may include a syndrome generator 44 and an error detector 46.

Functions of respective blocks shown in FIG. 6 will be described as follows.

The syndrome generator 44 may receive the 128-bit local data and the 8-bit local parity do, which are output from the memory cell array 26, and generate an 8-bit syndrome.

Figure 7:
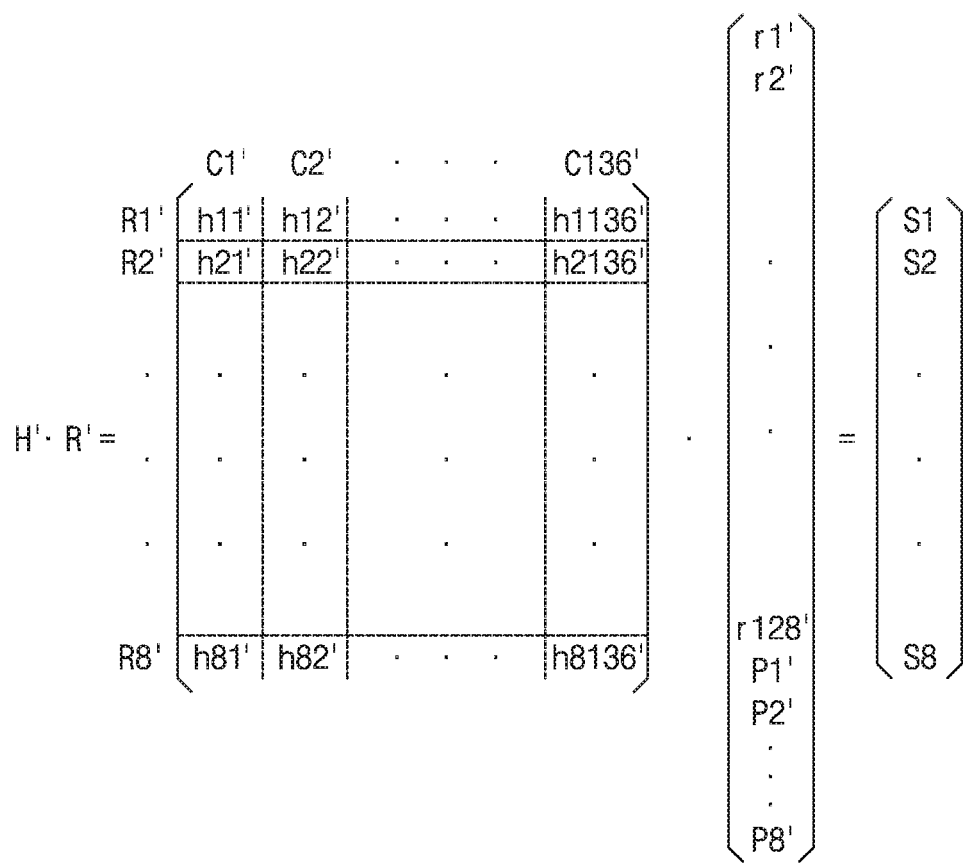
FIG. 7 is a diagram illustrating a syndrome operation of a syndrome generator according to an example embodiment.

FIG. 7 is a diagram illustrating a syndrome operation of a syndrome generator 44 according to an example embodiment.

Referring to FIG. 7, in a second H matrix H', codes h11' to h81', h12' to h82', . . . , and h1136' to h8136' of 136 column vectors C1' to C136' may have respectively different codes including "0" and/or "1" except codes having all "0" s. Further, for example, the second H matrix H' may be generated using a polynomial code "111001111" according to a CRC generation polynomial which is $X^8+X^7+X^6+X^3+X^2+X+1$. That is, the second H matrix H' may include codewords in which a minimum hamming distance dmin between any two codewords is 3 from among codewords in which a remainder obtained by dividing $2^{136}$ different datawords including codewords h11' to h1136', h21' to h2136', . . . , and h81' to h8136' of row vectors R1' to R8' by the polynomial code is 0. Similar to the first H matrix H, the second H matrix H' may detect every 1-bit error, a 2-bit error having two isolated 1-bit errors, and a multi-bit error having 8 consecutive bits.

That is, the 8-bit syndromes S1 to S8 may be expressed by the following equations:

$$S1 = h11' \wedge r1' + h12' \wedge r2' + \ldots + h1128' \wedge r128' + \ldots + h1136' \wedge P8'$$

$$S2 = h21' \wedge r1' + h22' \wedge r2' + \ldots + h2128' \wedge r128' + \ldots + h2136' \wedge P8'$$

$$\ldots$$

$$S8 = h81' \wedge r1' + h82' \wedge r2' + \ldots + h8128' \wedge r128' + \ldots + h8136' \wedge P8',$$

wherein "^" denotes an XOR operator, and "+" denotes a modulo-2 operator.

Referring to FIG. 6, the error detector 46 may generate a non-error signal NE indicating a non-error when all the 8-bit syndromes S1 to S8 are "0," generate a correctable error signal ER indicating a correctable error when the 8-bit syndromes S1 to S8 are included in codes of 136 column vectors C1' to C136' of the second H matrix H', or generate an uncorrectable error signal UE indicating an uncorrectable error when the 8-bit syndromes S1 to S8 are not present in the codes of the 136 column vectors C1' to C136' of the second H matrix H'.

Figure 8:
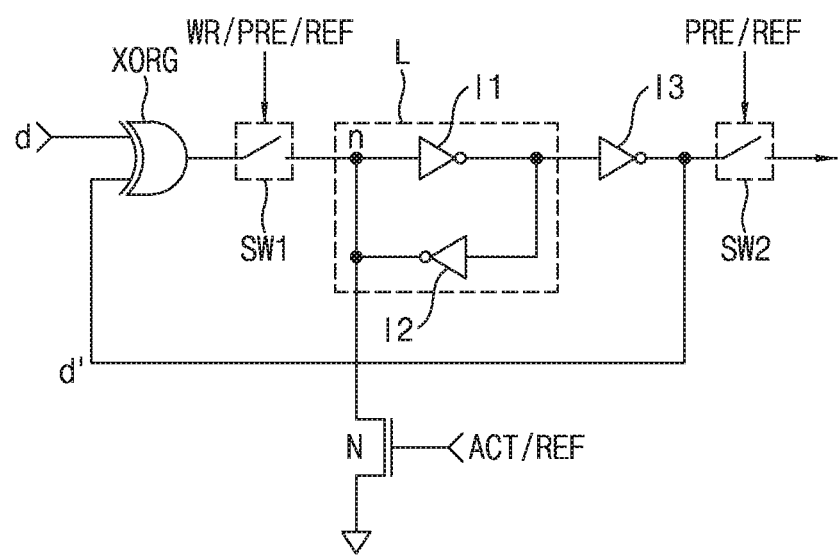
FIG. 8 is a circuit diagram illustrating a configuration of a register according to an example embodiment.

FIG. 8 is a circuit diagram illustrating a configuration of a register REG according to an example embodiment. The register REG may include an XOR gate XORG, a first switch SW1 and a second switch SW2, a latch L including a first inverter I1 and a second inverter I2, an NMOS transistor N, and a third inverter I3.

Functions of respective components shown in FIG. 8 will be described as follows.

The XOR gate XORG may perform an XOR operation on data d and data d'.

The first switch SW1 may be turned on in response to a write command WR, a precharge command PRE, or a refresh command REF and transmit an output signal of the XOR gate XORG to a node n. The precharge command PRE may be a word line precharge command to precharge a word line.

The latch L may invert and latch a signal of the node n.

The NMOS transistor N may reset the node n to a ground voltage level (data "0") in response to an active command ACT. Further, the NMOS transistor N may reset the node n to the ground voltage level at an initial stage (before the first switch SW1 is turned on) in response to a refresh command REF.

The third inverter I3 may invert the signal output from the latch L and generate the data d'.

The second switch SW2 may be turned on in response to the precharge command PRE or the refresh command REF.

FIGS. 9 to 12 are diagrams illustrating a global ECC encoding operation of a semiconductor memory device 100 according to an example embodiment. FIGS. 9 to 12 illustrate the global ECC encoding operation of the semiconductor memory device 100 when 128-bit local data and an 8-bit local parity d11d12 . . . d19 is stored in memory cells (not shown), which are selected in response to a word line selection signal wll of sub-memory blocks SMCA1 and SMCA1' of partial memory blocks PBLK1 and PBLK1' of memory blocks BLK1 to BLK8 and a local parity memory block BLKP of a memory block 26a of the semiconductor memory device 100, 128-bit local data and an 8-bit local parity d21d22 . . . d29 are stored in memory cells (not shown), which are selected in response to a word line selection signal wll of sub-memory blocks SMCA2 and SMCA2', and a 136-bit global parity D11D12 . . . D19 is stored in sub-memory blocks SMCA65 and SMCA65'.

Figure 9:
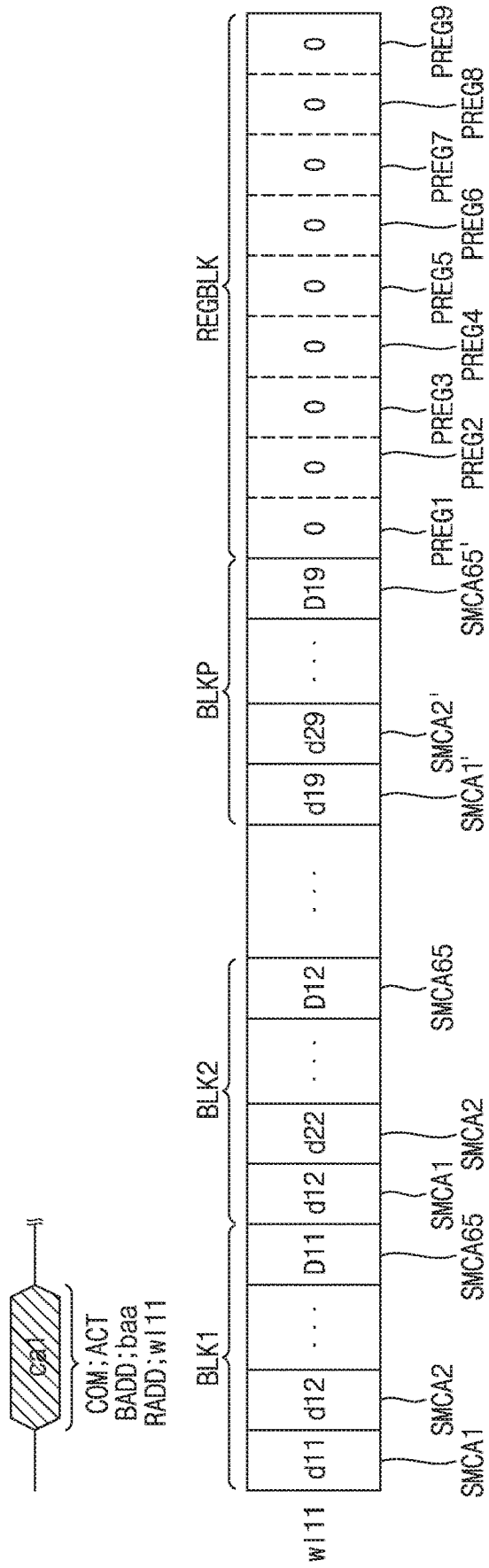
FIG. 9 is a diagram illustrating an operation of a semiconductor memory device when a command/address including an active command is applied, according to an example embodiment.

FIG. 9 is a diagram illustrating an operation of a semiconductor memory device 100 when a command/address ca1 including an active command ACT is applied as a command/address CA.

Referring to FIGS. 1A to 3 and FIGS. 8 and 9, when the command/address ca1 is applied, the semiconductor memory device 100 may decode a command signal COM included in the command/address ca1, generate the active command ACT, activate a bank selection signal baa using a bank address signal BADD included in the command/address ca1, and activate a word line selection signal wll using a row address signal RADD included in the command/address ca1.

When the active command ACT is generated, the partial register blocks PBLK1 to PBLK9 of the register block REGBLK of the memory bank 26a may be reset in response to the active command ACT. That is, all of 136-bit data of the partial register blocks PBLK1 to PBLK9 of the register block REGBLK may be reset to "0."

Figure 10:
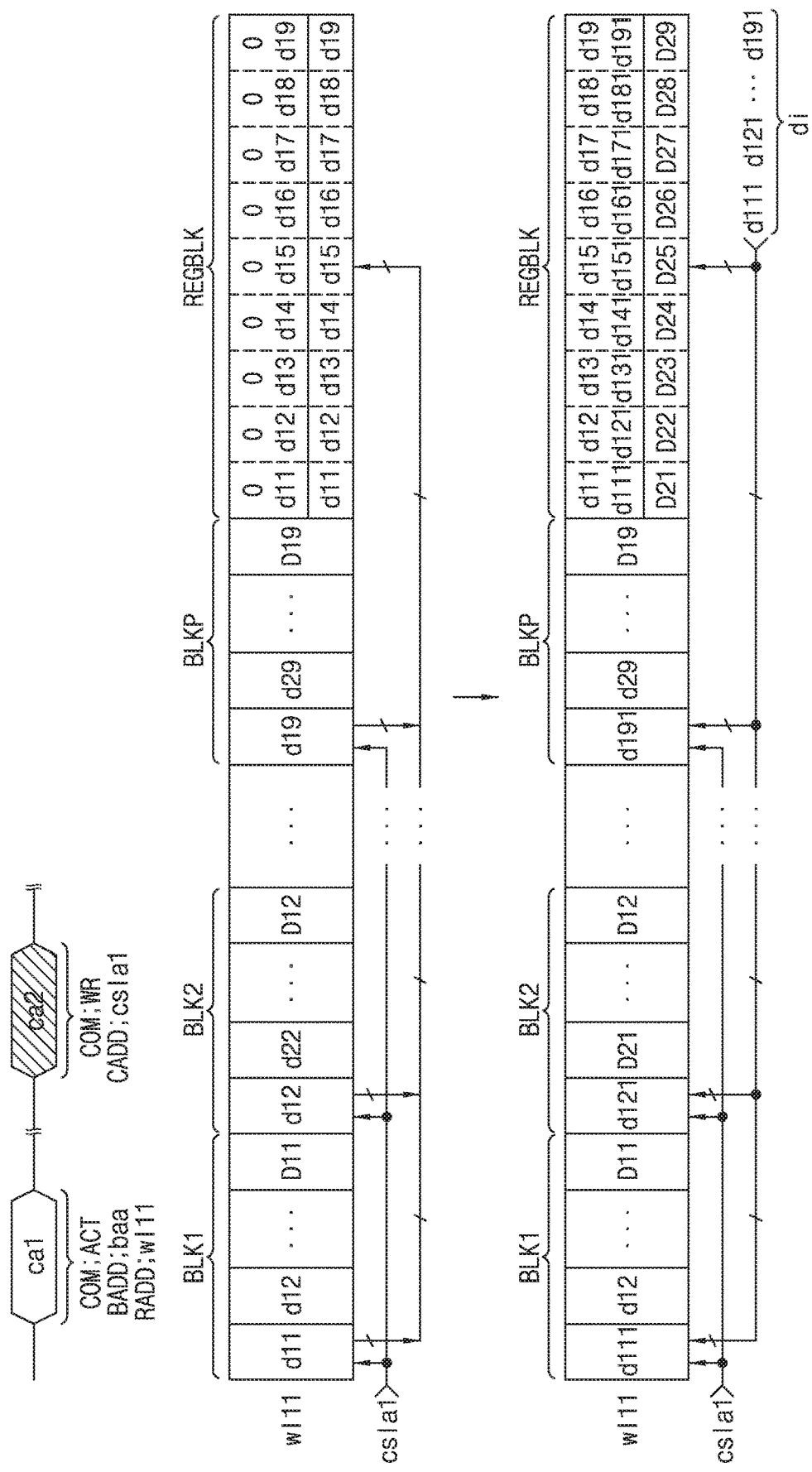
FIG. 10 is a diagram illustrating an operation of a semiconductor memory device when a command/address including a write command is applied, according to an example embodiment.

FIG. 10 is a diagram illustrating an operation of a semiconductor memory device 100 when a command/address ca2 including a write command WR is applied as a command/address CA.

Referring to FIGS. 1A to 3 and FIGS. 8 to 10, when a command/address ca2 is applied, the semiconductor memory device 100 may decode a command signal COM included in the command/address ca2, generate the write command WR, and activate a column selection signal csla1 using a column address signal CADD included in the command/address ca2. In this case, to begin with, previous data including previous 128-bit local data and an 8-bit local parity d11d12 . . . d19 stored in selected memory cells (not shown) of sub-memory blocks SMCA1 and SMCA1' of memory blocks BLK1 to BLK8 and a local parity memory block BLKP in response to the word line selection signal wll and the column selection signal csla1 may be transmitted to a register block REGBLK. The register block REGBLK may perform an XOR operation on data having all "0"s and the previous data d11d12 . . . d19 and generate the previous data d11d12 . . . d19. Next, new data including new 128-bit local data and the 8-bit local parity d111d121 . . . d191 may be stored in the selected memory cells (not shown) of the sub-memory blocks SMCA1 and SMCA1' of the memory blocks BLK1 to BLK8 and the local parity memory block BLKP in response to the word line selection signal wll and the column selection signal csla1. Simultaneously, the new data d111d121 . . . d191 may be transmitted to the register block REGBLK. The register block REGBLK may perform an XOR operation on the previous data d11d12 . . . d19 and the new data d111d121 . . . d191 and generate a middle global parity D21D22 . . . D29.

That is, when the write command WR is generated, the register block REGBLK may perform the XOR operation on the previous data d11d12 . . . d19 stored in the selected memory cells (not shown) and the new data d111d121 . . . d191 to be stored in the selected memory cells (not shown) and generate the middle global parity D21D22 . . . D29.

Figure 11:
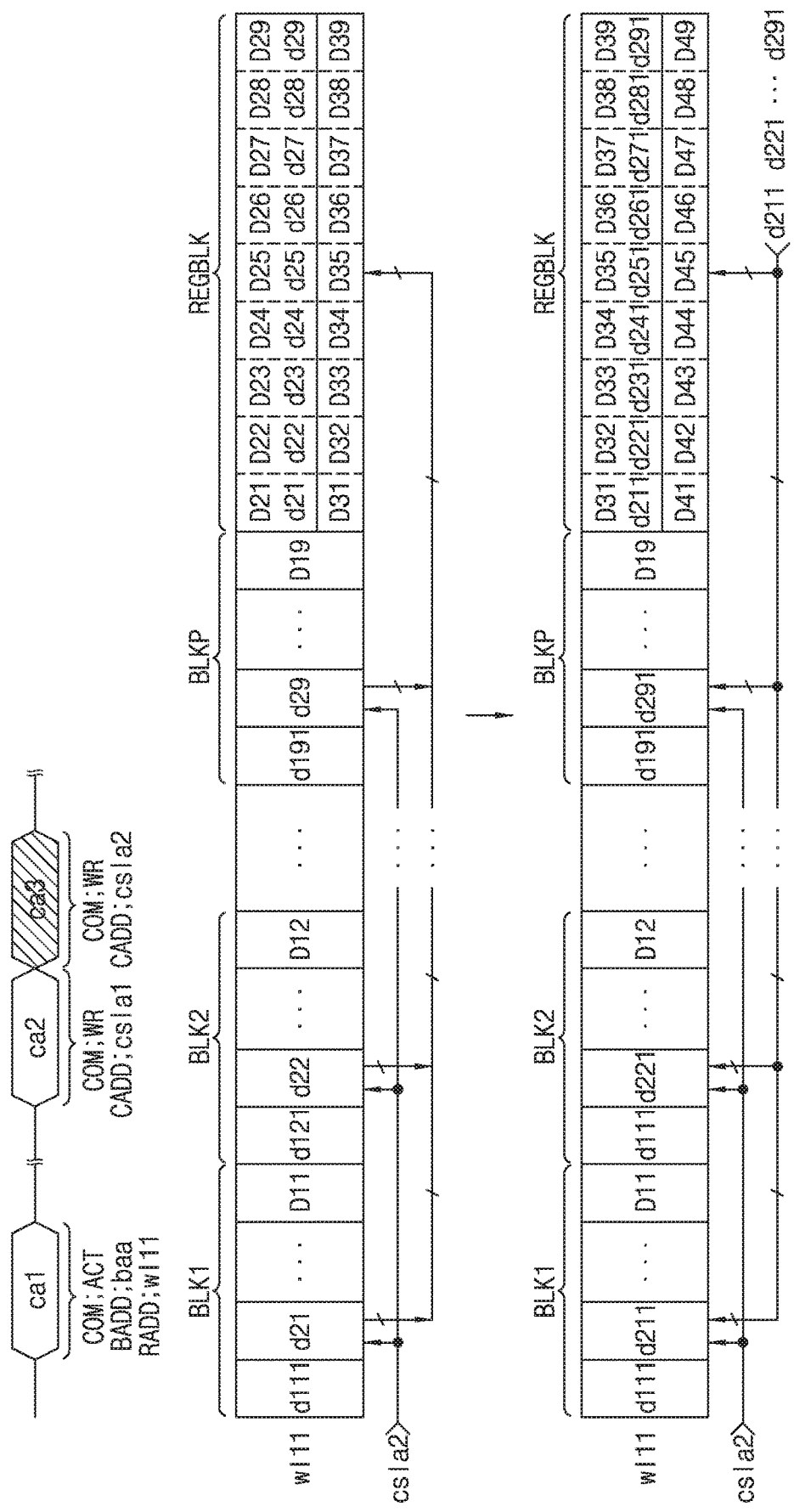
FIG. 11 is a diagram illustrating an operation of a semiconductor memory device 100 when a command/address including a write command is applied, according to an example embodiment.

FIG. 11 is a diagram illustrating an operation of a semiconductor memory device 100 when a command/address ca3 including a write command WR is applied as a command/address CA.

Referring to FIGS. 1A to 3 and FIGS. 8 to 11, when a command/address ca3 is applied, the semiconductor memory device 100 may decode a command signal COM included in the command/address ca3, generate the write command WR, and activate a column selection signal csla2 using a column address signal CADD included in the command/address ca3. In this case, to begin with, previous data including previous 128-bit local data and an 8-bit local parity d21d22 . . . d29 stored in selected memory cells (not shown) of sub-memory blocks SMCA2 and SMCA2' of memory blocks BLK1 to BLK8 and a local parity memory block BLKP in response to a word line selection signal wll and a column selection signal csla2 may be transmitted to the register block REGBLK. The register block REGBLK may perform an XOR operation on the middle global parity D21D22 . . . D29 and the previous data d21d22 . . . d29 and generate a middle global parity D31D32 . . . D39. Next, new data including new 128-bit data and a 8-bit local parity d211d221 . . . d291 may be stored in the selected memory cells (not shown) of the sub-memory blocks SMCA2 and SMCA2' of the memory blocks BLK1 to BLK8 and the local parity memory block BLKP in response to the word line selection signal wll and the column selection signal csla2. Simultaneously, the new data d211d221 . . . d291 may be transmitted to the register block REGBLK. The register block REGBLK may perform an XOR operation on the middle global parity D31D32 . . . D39 and the new data d211d221 . . . d291 and generate a middle global parity D41D42 . . . D49.

Figure 12:
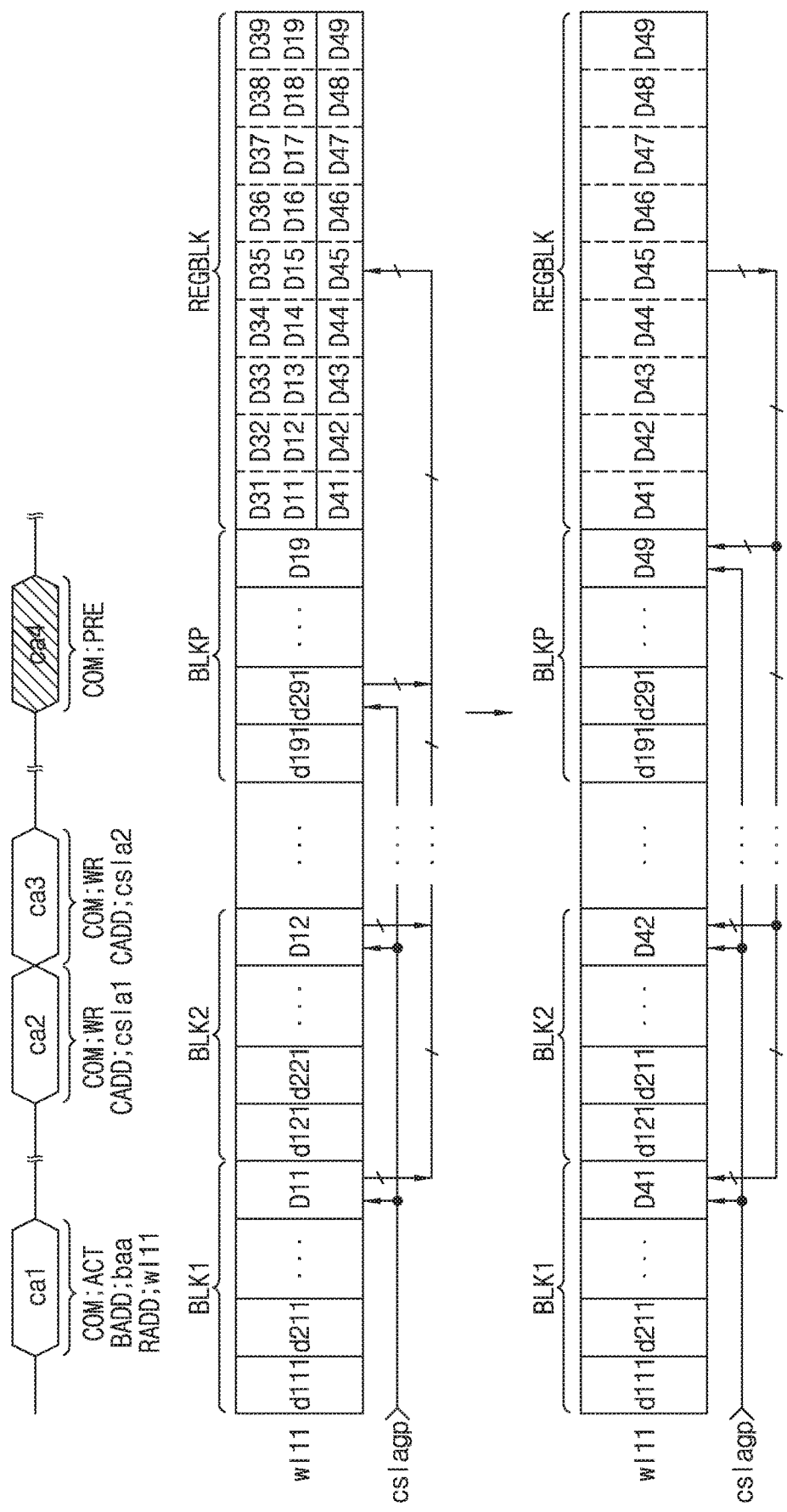
FIG. 12 is a diagram illustrating an operation of a semiconductor memory device when a command/address including a precharge command is applied, according to an example embodiment.

FIG. 12 is a diagram illustrating an operation of a semiconductor memory device 100 when a command/address ca4 including a precharge command PRE is applied as a command/address CA.

Referring to FIGS. 1A to 3 and FIGS. 8 to 12, when the command/address ca4 is applied, the semiconductor memory device 100 may decode a command signal COM included in the command/address ca4 and generate the precharge command PRE. In this case, to begin with, a previous global parity D11D12 . . . D19 stored in selected memory cells (not shown) of sub-memory blocks SMCA65 and SMCA65' of memory blocks BLK1 to BLK8 and a local parity memory block BLKP in response to a word line selection signal wl11 and a column selection signal cslagp may be transmitted to the register block REGBLK. The register block REGBLK may perform an XOR operation on the middle global parity D31D32 . . . D39 and the previous global parity D11D12 . . . D19 and generate a new global parity D41D42 . . . D49. Next, the new global parity D41D42 . . . D49 generated by the register block REGBLK may be stored in the selected memory cells (not shown) of the sub-memory blocks SMCA65 and SMCA65' of the memory blocks BLK1 to BLK8 and the local parity memory block BLKP in response to the word line selection signal will and the column selection signal cslagp.

As described above, in the global ECC encoding operation of the semiconductor memory device according to an example embodiment, the register block REGBLK may perform an XOR operation on previous data, new data, and a previous global parity using a simple even parity (SEP) method and generate a new global parity.

As another example, the global ECC encoding operation according to an example embodiment may be performed in a manner different from that described above with reference to FIGS. 9 to 12. Referring to FIGS. 9 and 12, when the active command ACT is generated, the partial register blocks PBLK1 to PBLK9 of a register block REGBLK of a memory bank 26a may be reset in response to the active command ACT. Further, the previous global parity D11D12 . . . D19 stored in selected memory cells (not shown) of the sub-memory blocks SMCA65 and SMCA65' of the memory blocks BLK1 to BLK8 and the local parity memory block BLKP in response to the word line selection signal will and the column selection signal cslagp may be transmitted to the register block REGBLK. That is, when the active command ACT is generated, the previous global parity D11D12 . . . D19 may be stored in the partial register blocks PBLK1 to PBLK9 of the register block REGBLK. In this case, when the precharge command PRE is generated, the previous global parity D11D12 . . . D19 may not need to be transmitted to the register block REGBLK, and data stored in the register block REGBLK is a new global parity. Thus, the new global parity stored in the register block REGBLK may be stored in the selected memory cells (not shown) of the sub-memory blocks SMCA65 and SMCA65' of the memory blocks BLK1 to BLK8 and the local parity memory block BLKP in response to the word line selection signal will and the column selection signal cslagp.

Figure 13:
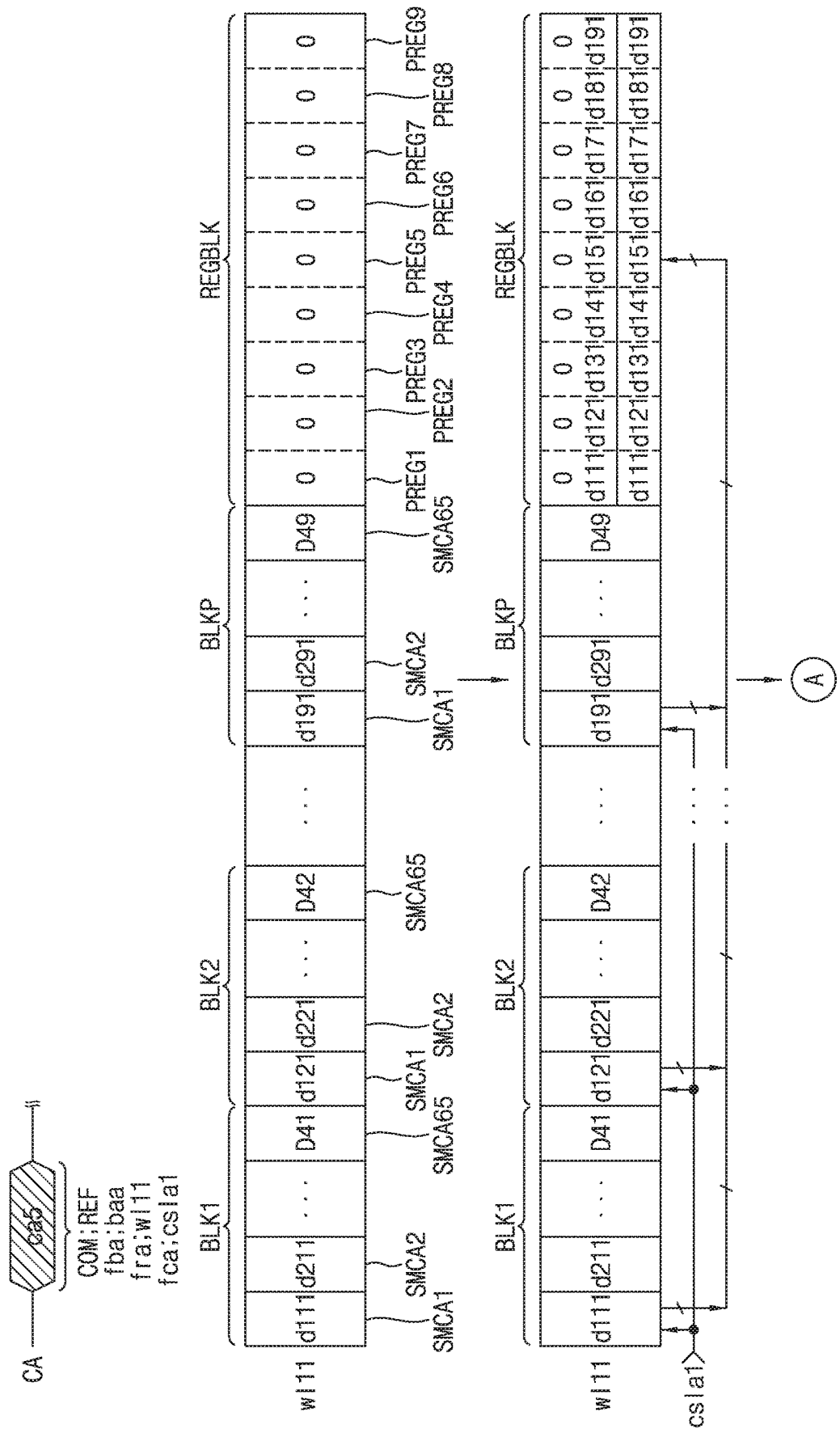
FIGS. 13 to 15 are diagrams illustrating a global ECC decoding operation of a semiconductor memory device according to an example embodiment.
Figure 14:
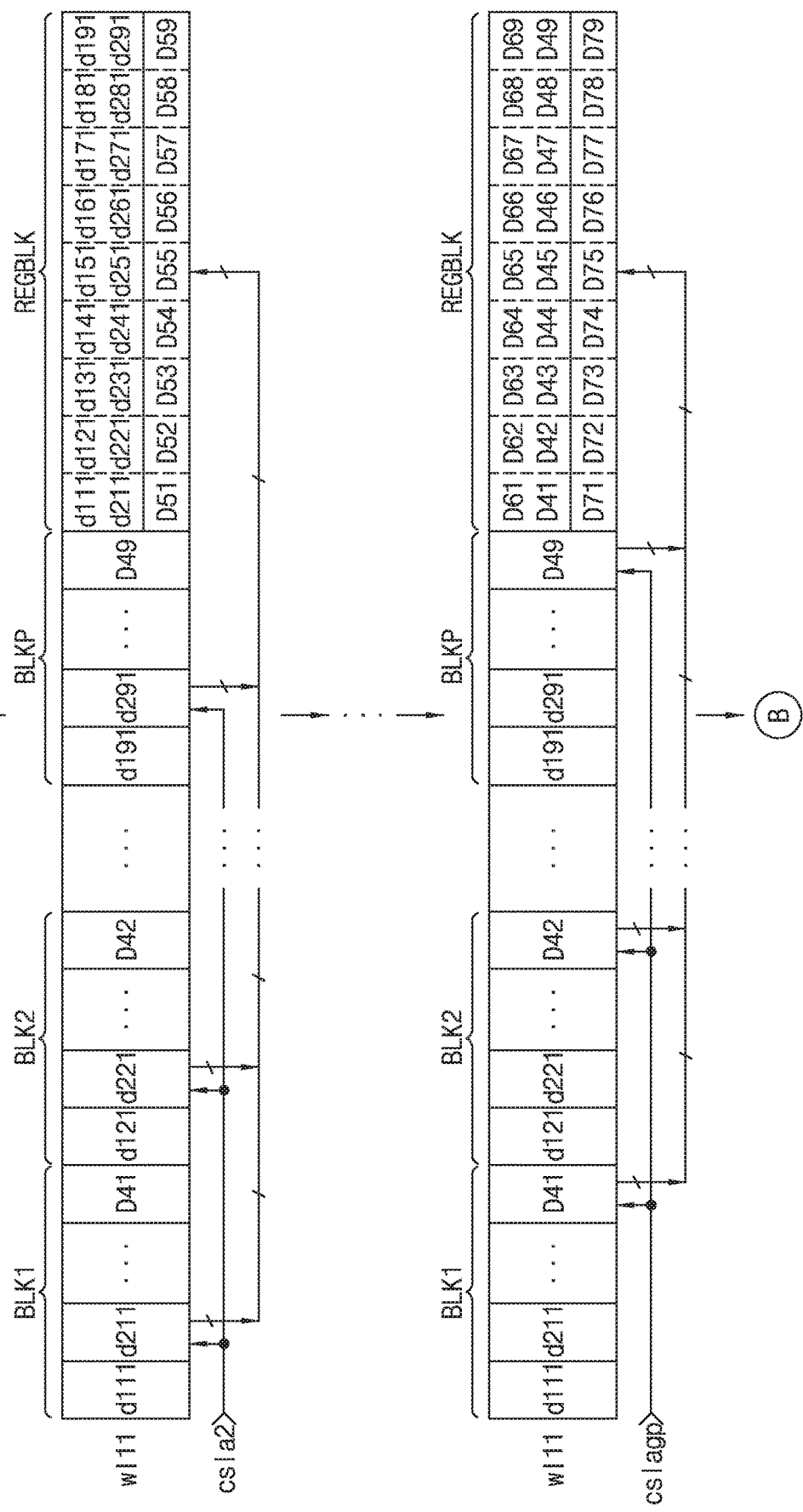
Figure 15:
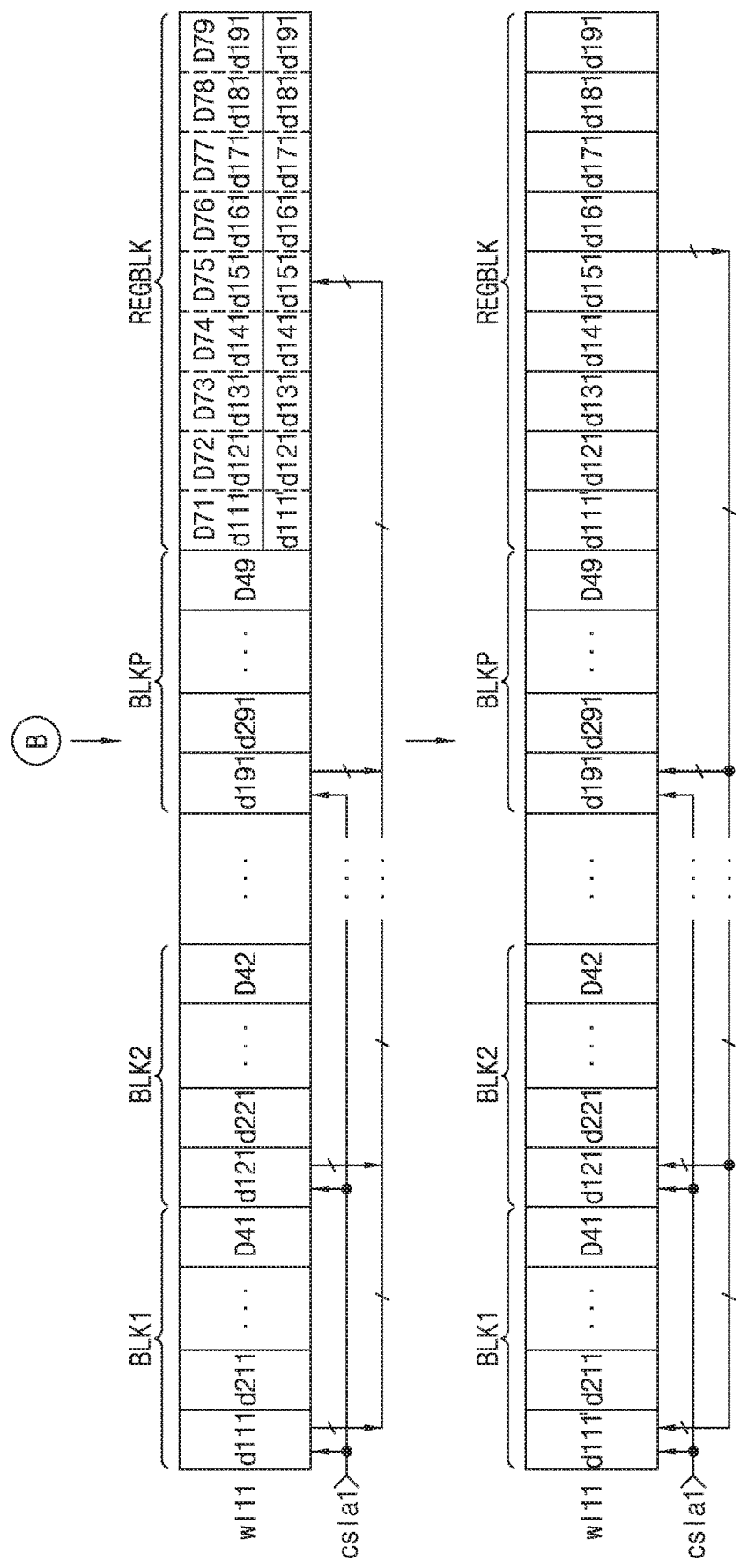

FIGS. 13 to 15 are diagrams illustrating a global ECC decoding operation of a semiconductor memory device 100 according to an example embodiment. FIGS. 13 to 15 are diagrams illustrating the global ECC decoding operation of the semiconductor memory device 100 when a fail bank address fba for indicating a memory bank 26a, a fail row address fra for indicating a word line selection signal wl11, and a fail column address fca for indicating a column selection signal csla1 are stored in an error address storage 36. That is, FIGS. 13 to 15 are diagrams illustrating operations of the semiconductor memory device 100 in a case in which an error is detected in data d111d121 . . . d191 stored in sub-memory blocks SMCA1 and SMCA1' of memory blocks BLK1 to BLK8 and a local parity memory block BLKP in response to the word line selection signal will and the column selection signal csla1 shown in FIG. 12.

Referring to FIGS. 1A to 3, 12, and 13, when a command/address ca5 is applied, the semiconductor memory device 100 may decode a command signal COM included in the command/address ca5 and generate a refresh command REF. To begin with, all data of partial register blocks PBLK1 to PBLK9 of a register block REGBLK may be reset to "0" in response to the refresh command REF. That is, all of 136 registers REG of the register block REGBLK may be reset to "0." Further, the error address storage 36 may generate the fail bank address fba and the fail row address fra in response to the refresh command REF. The row decoder 18a of the memory bank 26a may activate the word line selection signal will in response to the fail bank address fba and the fail row address fra. Further, the column decoder 24a of the memory bank 26a may activate the column selection signal csla1 in response to the refresh command REF and the fail bank address fba. Previous data including previous 128-bit local data and an 8-bit local parity d111d121 . . . d191, which are stored in selected memory cells (not shown) of the sub-memory blocks SMCA1 and SMCA1' of the memory blocks BLK1 to BLK8 and the local parity memory block BLKP in response to the word line selection signal will and the column selection signal csla1 may be stored in the register block REGBLK. The register block REGBLK may perform an XOR operation on data having all "0"s and the previous data d111d121 . . . d191 and generate the previous data d111d121 . . . d191.

Referring to FIGS. 1A to 3 and FIGS. 12 to 14, the column decoder 24a may activate a column selection signal csla2. Previous data including previous 128-bit local data and a 8-bit local parity d211d221 . . . d291, which are stored in selected memory cells (not shown) of the sub-memory blocks SMCA2 and SMCA2' of the memory blocks BLK1 to BLK8 and the local parity memory block BLKP in response to the word line selection signal will and the column selection signal csla2 may be stored in the register block REGBLK. The register block REGBLK may perform an XOR operation on the previous data d111d121 . . . d191 and the previous data d211d221 . . . d291 and generate a middle global parity D51D52 . . . D59.

Although not shown, the column decoder 24a may sequentially activate subsequent column selection signals csla3 to csla64. Corresponding previous 128-bit local data and an 8-bit local parity, which are stored in selected memory cells (not shown) of corresponding sub-memory blocks SMCA3 and SMCA3', SMCA4 and SMCA4', . . . , or SMCA64 and SMCA64' of the memory blocks BLK1 to BLK8 and the local parity memory block BLKP in response to the word line selection signal will and the corresponding column selection signal csla3, csla4, . . . , or csla64 may be sequentially stored in the register block REGBLK. The register block REGBLK may sequentially perform an XOR operation on the middle global parity D51D52 . . . D59 and previous data and generate a middle global parity D61D62 . . . D69.

Furthermore, the column decoder 24a may activate a global parity column selection signal calagp. A previous global parity D41D42 . . . D49, which is stored in selected memory cells (not shown) of sub-memory block SMCA65 and SMCA65' of the memory blocks BLK1 to BLK8 and the local parity memory block BLKP in response to the word line selection signal will and a global parity column selection signal cslagp may be stored in the register block REGBLK. The register block REGBLK may perform an XOR operation on the middle global parity D61D62 . . . D69 and the previous global parity D41D42 . . . D49 and generate error position data D71D72 . . . D79.

When the above-described operation is performed, error position data indicating a position of an error having one bit of "1", two isolated bits of "1", or a plurality of bits of "1" within, 8 consecutive bits of data d111d121 . . . d191 may be detected. That is, 136 bits of the error position data D71 D72 . . . D79 may include one bit of "1," two isolated bits of "1," or a plurality of bits of "1" within 8 consecutive bits.

Next, referring to FIGS. 1A to 3 and FIGS. 12 to 15, the error address storage 36 may generate a fail column address fca, and the column decoder 24a may activate the column selection signal csla1. In response to the word line selection signal will and the column selection signal csla1, previous fail data including 128-bit local data and an 8-bit global parity d111d121 . . . d191, which are stored in selected memory cells (not shown) of the sub-memory blocks SMCA1 and SMCA1' of the memory blocks BLK1 to BLK8 and the local parity memory block BLKP, may be stored in the register block REGBLK. The register block REGBLK may perform an XOR operation on the error position data D71D72 . . . D79 and the previous fail data d111 d121 . . . d191 and generate 128-bit local data and an 8-bit local parity d111 d121 . . . d191 in which the error is corrected. That is, data D72 . . . D79 of the error position data D71D72 . . . D79 may all be "0," and data D71 may be "10000000000000000." In this case, there may be an error in the most significant bit (MSB) of the data dill of the previous fail data d111d121 . . . d191, and the error may be corrected by inverting the MSB of the data d111.

Next, data d111'd121 . . . d191 stored in the register block REGBLK may be stored in selected memory cells (not shown) of the sub-memory blocks SMCA1 and SMCA1' of the memory blocks BLK1 to BLK8 and the local parity memory block BLKP in response to the word line selection signal will and the column selection signal csla1. Thus, the global ECC decoding operation may be completed.

Although not shown, when the above-described global ECC decoding operation is performed, a position of a 2-bit error having two isolated bits in data d111d121 . . . d191 or a position of a multi-bit error within 8 consecutive bits may be detected and corrected.

Although the semiconductor memory device according to the above-described embodiment performs a global ECC decoding operation when a refresh command REF is generated, the semiconductor memory device may perform the global ECC decoding operation when an error check and scrubbing command ECS is generated.

Furthermore, when the refresh command REF is generated, the semiconductor memory device according to the above-described embodiment may perform a refresh operation on a memory bank 26b, 26c, or 26d except for the fail memory bank 26a during the global ECC decoding operation on the fail memory bank 26a.

The semiconductor memory device according to the above-described example embodiment may detect whether there is an error using a CRC method during local ECC encoding and decoding operations and detect and correct an error position using an SEP method during global ECC encoding and decoding operations.

However, unlike that described above, the semiconductor memory device may be configured to detect and correct at least a 1-bit error during the local ECC encoding and decoding operations and detect and correct at least a 2-bit error during the global ECC encoding and decoding operations.

In addition, although the semiconductor memory device according to the above-described example embodiment includes four memory banks, this is only an example. In some example embodiments, the semiconductor memory device may be configured to include fewer than four memory banks, or greater than four memory banks, i.e., the semiconductor memory device may be configured to include at least one memory bank.

Figure 16:
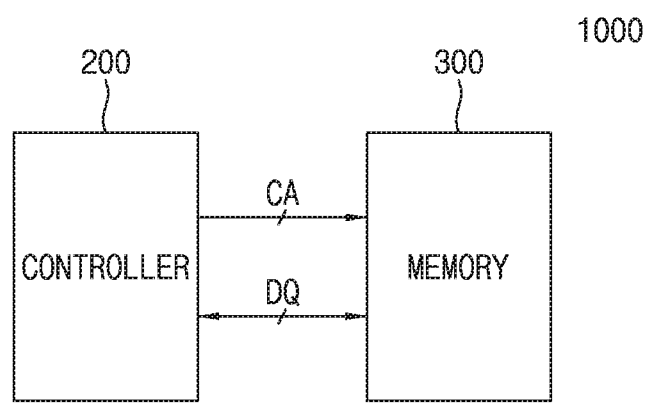
FIG. 16 is a block diagram illustrating a memory system according to an example embodiment.

FIG. 16 is a block diagram illustrating a memory system 1000 according to an example embodiment. The memory system 1000 may include a controller 200 and a memory 300.

Referring to FIG. 16, the controller 200 may transmit a command/address CA and receive and output data DQ. The memory 300 may receive the command/address CA and receive and output the data DQ.

In FIG. 16, the memory 300 may be the semiconductor memory device 100 described above with reference to FIGS. 1A to 15 or a memory module in which a plurality of semiconductor memory devices 100 are disposed.

According to the example embodiments, a semiconductor memory device and a memory system including the same may perform an ECC encoding operation and an ECC decoding operation on data of at least two different data units (e.g., a local data unit and a global data unit). Thus, reliability of operations of the semiconductor memory device and the memory system including the same may be improved.

While various example embodiments have been described with reference to the accompanying drawings, it should be understood by those skilled in the art that various modifications may be made without departing from the scope of the present disclosure and without changing essential features thereof. Therefore, the above-described embodiments should be considered in a descriptive sense only and not for purposes of limitation.

What is claimed is:

1. A semiconductor memory device comprising:
a memory cell array comprising:
a plurality of memory blocks configured to respectively store a plurality of pieces of partial local data in response to a plurality of column selection signals, and a first partial global parity in response to a global parity column selection signal;
a local parity memory block configured to store a plurality of local parities of a plurality of pieces of local data in response to the plurality of column selection signals, and a second partial global parity in response to the global parity column selection signal; and
a register block configured to generate a global parity comprising the plurality of first partial global parities and the second partial global parity,
wherein each of the plurality of pieces of local data comprises the plurality of pieces of partial local data, and the global parity is a parity of the plurality of pieces of local data and the plurality of local parities, and
wherein each of the local parity memory block and the plurality of memory blocks comprises:
a plurality of first sub-memory blocks configured to respectively store the partial local data or the local parities in response to a plurality of word line selection signals and the plurality of column selection signals; and
a second sub-memory block configured to store the first partial global parity or the second partial global parity in response to the plurality of word line selection signals and the global parity column selection signal.

2. The semiconductor memory device of claim 1, further comprising:

a command and address generator configured to receive a command and address, which is applied from an outside, decode a command signal included in the command and address, generate an active command, a write command, or a precharge command, and generate a row address or a column address using an address signal included in the command and address; and an error correcting code (ECC) encoder configured to receive new local data and generate a new local parity of the new local data when the write command is applied, wherein, when the write command is applied, the memory cell array outputs previous local data and a previous local parity, which are stored in selected first sub-memory blocks of the plurality of first sub-memory blocks of each of the plurality of memory blocks and the local parity memory block in response to a corresponding word line selection signal of the plurality of word line selection signals, which are generated in response to the row address, and a corresponding column selection signal of the plurality of column selection signals, which are generated in response to the column address, to the register block, and receives and stores the new local data and the new local parity therein, and the register block generates a middle global parity using the previous local data, the previous local parity, the new local data, and the new local parity.

3. The semiconductor memory device of claim 2, wherein the ECC encoder generates the new local parity using the new local data and a cyclical redundancy check (CRC) generation polynomial, which is $X^8+X^7+X^6+X^3+X^2+X+1$.

4. The semiconductor memory device of claim 2, wherein, when the active command is applied, the register block is reset.

5. The semiconductor memory device of claim 2, wherein, when the precharge command is applied, the second sub-memory blocks of the plurality of memory blocks and the local parity memory block output a previous global parity, which is stored, in response to the corresponding word line selection signal of the plurality of word line selection signals and the global parity column selection signal, to the register block, and wherein the register block performs a global ECC encoding operation of generating a new global parity using the middle global parity and the previous global parity and outputting the new global parity to the second sub-memory blocks of the plurality of memory blocks and the local parity memory block in response to the corresponding word line selection signal and the global parity column selection signal.

6. The semiconductor memory device of claim 2, wherein the command and address generator decodes the command signal and further generates a read command, or a refresh command or error check and scrubbing command, wherein the semiconductor memory device further comprises:

an ECC decoder configured to receive the previous local data and the previous local parity, which are stored in the selected first sub-memory blocks, and determine whether there is an error in the previous local data and the previous local parity when the read command is applied and generate an error signal when it is determined that the error is present; and an error address storage configured to store the row address and the column address as a fail row address and a fail column address in response to the error signal.

7. The semiconductor memory device of claim 6, wherein the ECC decoder detects the error using the previous local data, the previous local parity, and a CRC generation polynomial, which is $X^8+X^7+X^6+X^3+X^2+X+1$.

8. The semiconductor memory device of claim 6, wherein, when the refresh command or error check and scrubbing command is applied, the register block is reset.

9. The semiconductor memory device of claim 6, wherein, when the refresh command or error check and scrubbing command is applied, the plurality of first sub-memory blocks and the second sub-memory block of each of the local parity memory block and the plurality of memory blocks sequentially output a plurality of pieces of previous local data and previous local parities, which are stored, and a previous global parity in response to the corresponding word line selection signal of the plurality of word line selection signals, which are generated in response to the fail row address, and the plurality of column selection signals and the global parity column selection signal, which are sequentially activated, to the register block, and the selected first sub-memory blocks of the plurality of first sub-memory blocks of each of the local parity memory block and the plurality of memory blocks output previous local data and the previous local parity, which comprise an error, in response to the corresponding word line selection signal of the plurality of word line selection signals, which are generated in response to the fail row address, and the corresponding column selection signal of the plurality of column selection signals, which are generated in response to the fail column address, to the register block and store previous local data and the previous local parity, in which the error is corrected, therein, and wherein the register block performs a global ECC decoding operation of generating error position data including an error position using a plurality of previous local data and the previous local parities, and the previous global parity which are sequentially applied, and outputting the previous local data and the previous local parity, in which the error is corrected, using the error position data, and the previous local data and the previous local parity which include the error.

10. The semiconductor memory device of claim 9, wherein the memory cell array comprises a predetermined number of memory banks, wherein each of the predetermined number of memory banks comprises the plurality of memory blocks, the local parity memory block, and the register block, and wherein, when the refresh command is applied, one of the predetermined number of memory banks performs a global ECC decoding operation, and another one of the predetermined number of memory banks performs a refresh operation.

11. The semiconductor memory device of claim 1, further comprising:

a command and address generator configured to receive a command and address, which is applied from an outside, decode a command signal included in the command and address, generate an active command, a write command, or a precharge command, and generate a row address or a column address using an address signal included in the command and address; and an error correcting code (ECC) encoder configured to receive new local data and generate a new local parity of the new local data when the write command is applied, wherein, when the active command is applied, the register block is reset, the second sub-memory blocks of the plurality of memory blocks and the local parity memory block output a previous global parity in response to a corresponding word line selection signal of the plurality of word line selection signals, which are generated in response to the row address, and the global parity column selection signal, the register block stores the previous global parity, and the register block stores the previous global parity, and wherein, when the write command is applied, selected first sub-memory blocks of the plurality of first sub-memory blocks of each of the plurality of memory blocks and the local parity memory block, output previous local data and a previous local party, which are stored therein in response to the corresponding word line selection signal of the plurality of word line selection signals, which are generated in response to the row address, and a corresponding column selection signal of the plurality of column selection signals, which are generated in response to the column address, to the register block, and receive the new local data and the new local parity and store therein, and the register block generates a middle global parity using the previous global parity, the previous local data, a previous local parity, the new local data, and the new local parity.

12. The semiconductor memory device of claim 11, wherein, when the precharge command is applied, the register block performs a global ECC encoding operation of outputting a new global parity to the second sub-memory blocks of the plurality of memory blocks and the local parity memory block in response to the corresponding word line selection signal of the plurality of word line selection signals and the global parity column selection signal.

13. The semiconductor memory device of claim 1, wherein the register block generates the global parity using a simple even parity (SEP) method and comprises a plurality of partial register blocks, wherein each of the plurality of partial register blocks comprises:
a XOR gate configured to perform an XOR operation on a latched signal and an input signal and generate an output signal; and
a latch configured to latch the output signal.

14. A memory system comprising:
a controller configured to output a command and address, transmit input data, and receive output data; and
a memory configured to receive the command and address and the input data and transmit the output data,
wherein the memory comprises a memory cell array comprising:
a plurality of memory blocks configured to respectively store a plurality of pieces of partial local data in response to a plurality of column selection signals and a first partial global parity in response to a global parity column selection signal;
a local parity memory block configured to store a plurality of local parities of a plurality of pieces of local data in response to the plurality of column selection signals, and a second partial global parity in response to the global parity column selection signal; and
a register block configured to generate a global parity comprising the plurality of first partial global parities and the second partial global parity, and
wherein each of the plurality of pieces of local data comprises the plurality of pieces of partial local data, and the global parity is a parity of the plurality of pieces of local data and the plurality of local parities, wherein each of a plurality of first memory blocks and the local parity memory block comprises:
a plurality of first sub-memory blocks configured to respectively store the partial local data or the local partities in response to a plurality of word line selection signals and of the plurality of column selection signals; and
a second sub-memory block configured to store the first partial global parity or the second partial global parity in response to the plurality of word line selection signals and the global parity column selection signal.

15. The memory system of claim 14, wherein the memory further comprises:
a command and address generator configured to receive the command and address, which is applied from an outside the memory, decode a command signal included in the command and address, generate an active command, a write command, or a precharge command, and generate a row address or a column address using an address signal included in the command and address; and
an error correcting code (ECC) encoder configured to receive new local data and generate a new local parity of the new local data when the write command is applied, and
wherein, when the write command is applied, the memory cell array outputs previous local data and a previous local parity, which are stored in selected first sub-memory blocks of the plurality of first sub-memory blocks of each of the plurality of memory blocks and the local parity memory block in response to a corresponding word line selection signal of the plurality of word line selection signals, which are generated in response to the row address, and a corresponding column selection signal of the plurality of column selection signals, which are generated in response to the column address, to the register block, and receives and stores the new local data and the new local parity therein, and the register block generates a middle global parity using the previous local data, the previous local parity, the new local data, and the new local parity.

16. The memory system of claim 15, wherein, when the precharge command is applied, the second sub-memory blocks of the plurality of memory blocks and the local parity memory block output a previous global parity, which is stored therein, in response to the corresponding word line selection signal of the plurality of word line selection signals and the global parity column selection signal, to the register block, and
wherein the register block performs a global ECC encoding operation of generating a new global parity using the middle global parity and the previous global parity and outputting the new global parity to the second sub-memory blocks of the plurality of memory blocks and the local parity memory block in response to the corresponding word line selection signal and the global parity column selection signal.

17. The memory system of claim 16, wherein the command and address generator decodes the command signal and further generates a read command, or a refresh command or error check and scrubbing command,
wherein the memory further comprises:
an ECC decoder configured to receive the previous local data and the previous local parity, which are stored in the selected first sub-memory blocks, determine whether there is an error in the previous local data and the previous local parity, and generate an error signal when it is determined that the error is present, when the read command is applied; and an error address storage configured to store the row address and the column address as a fail row address and a fail column address in response to the error signal.

18. The memory system of claim 17, wherein, when the refresh command or error check and scrubbing command is applied, the plurality of first sub-memory blocks and the second sub-memory block of each of the local parity memory block and the plurality of memory blocks sequentially output a plurality of previous local data, previous local parties, and the previous global parity, which are stored therein, in response to the corresponding word line selection signal of the plurality of word line selection signals, which are generated in response to the fail row address, and the plurality of column selection signals and the global parity column selection signal, which are sequentially activated, to the register block, and the selected first sub-memory blocks of the plurality of first sub-memory blocks of each of the local parity memory block and the plurality of memory blocks output previous local data and the previous local parity, which include an error, in response to the corresponding word line selection signal of the plurality of word line selection signals, which are generated in response to the fail row address, and the corresponding column selection signal of the plurality of column selection signals, which are generated in response to the fail column address, to the register block and store previous local data and the previous local parity, in which the error is corrected, therein, and wherein the register block performs a global ECC decoding operation of generating error position data including an error position using the plurality of previous local data, previous local parities, and the previous global parity, which are sequentially applied, and outputting the previous local data and the previous local parity, in which the error is corrected, using the error position data, and the previous local data and the previous local parity, which include the error.

* * * * *